US006127198A

United States Patent [19]

Coleman et al.

[11] Patent Number: 6,127,198

[45] Date of Patent: Oct. 3, 2000

[54] METHOD OF FABRICATING A FLUID DROP EJECTOR

[75] Inventors: Charles P. Coleman, Rochester; Arthur M. Gooray; George J. Roller, both of Penfield; Kathleen A. Feinberg, Rochester, all of N.Y.

[73] Assignee: Xerox Corporation, Stamford, Conn.

[21] Appl. No.: 09/416,290

[22] Filed: Oct. 14, 1999

Related U.S. Application Data

[60] Provisional application No. 60/104,363, Oct. 15, 1998.

[51] Int. Cl.[7] ........ H01L 21/00

[52] U.S. Cl. ........ 438/21; 29/890.1; 347/1; 347/68; 347/71; 347/29; 347/9; 347/3; 205/75; 346/1.1; 346/140 R

[58] Field of Search ........ 438/21; 346/1.1, 346/140 R; 205/75; 347/1, 29, 20, 9, 3, 63, 68, 71; 216/27; 29/890.1

[56] References Cited

U.S. PATENT DOCUMENTS

| | | | |
|---|---|---|---|
| 5,087,930 | 2/1992 | Roy et al. | 346/140 R |
| 5,463,411 | 10/1995 | Wehl | 347/65 |
| 5,506,608 | 4/1996 | Marler et al. | 347/18 |
| 5,565,113 | 10/1996 | Hadimioglu et al. | 216/2 |
| 5,581,861 | 12/1996 | Lee et al. | 29/25.35 |
| 5,685,491 | 11/1997 | Marks et al. | 239/533.12 |
| 5,929,875 | 7/1999 | Su et al. | 347/19 |

*Primary Examiner*—Matthew Smith

*Assistant Examiner*—Renzo N. Rocchegiani

[57] ABSTRACT

The silicon fluid ejector of the present invention includes an electrostatically actuated micromachined positive displacement mechanism consisting of a piston, piston containment structure, piston retraction mechanism and an ejection orifice. These features provide for very low cost of production, high reliability and "on demand" drop size, modulation. The fluid ejector mechanism can be easily produced via monolithic batch fabrication based on the common production technique of surface micromachining.

8 Claims, 16 Drawing Sheets

FIG. 4
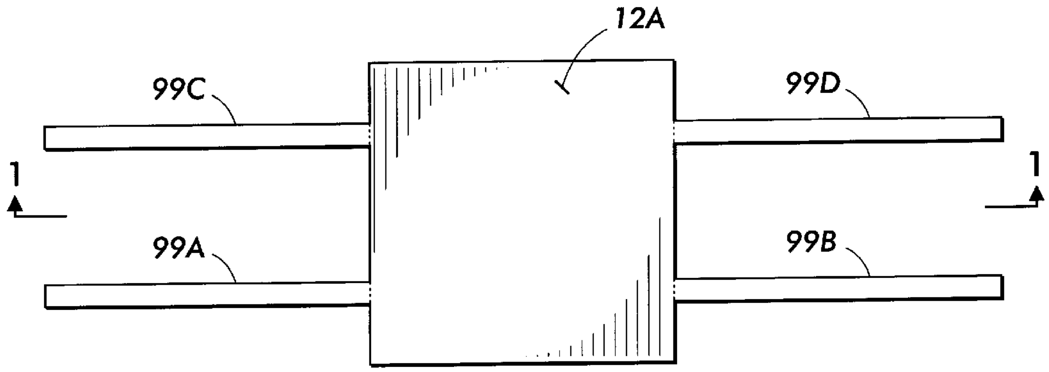
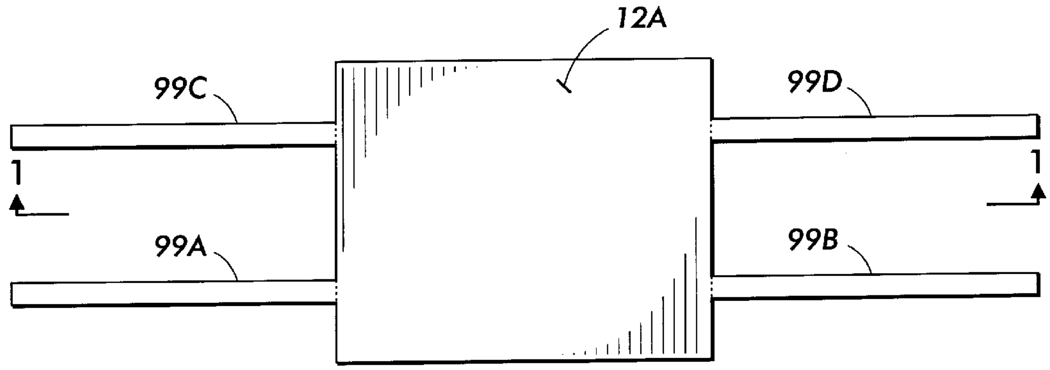
FIG. 5
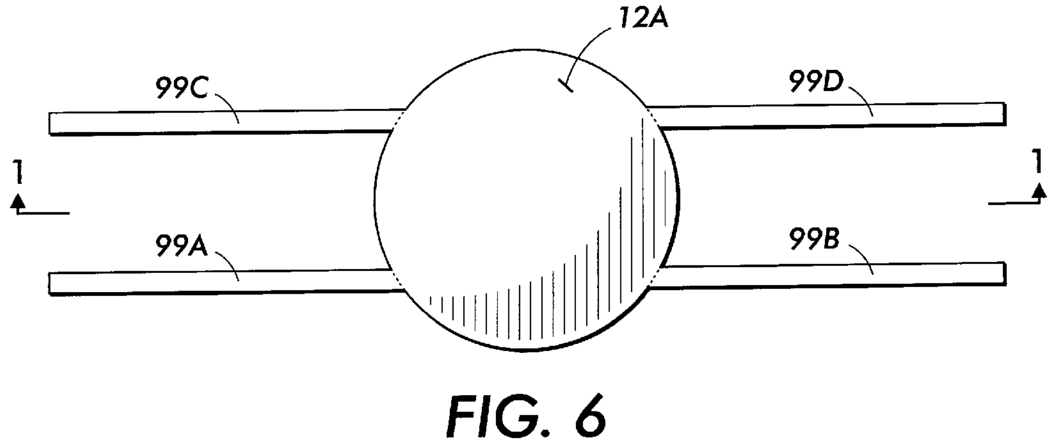
FIG. 6

FIG. 7
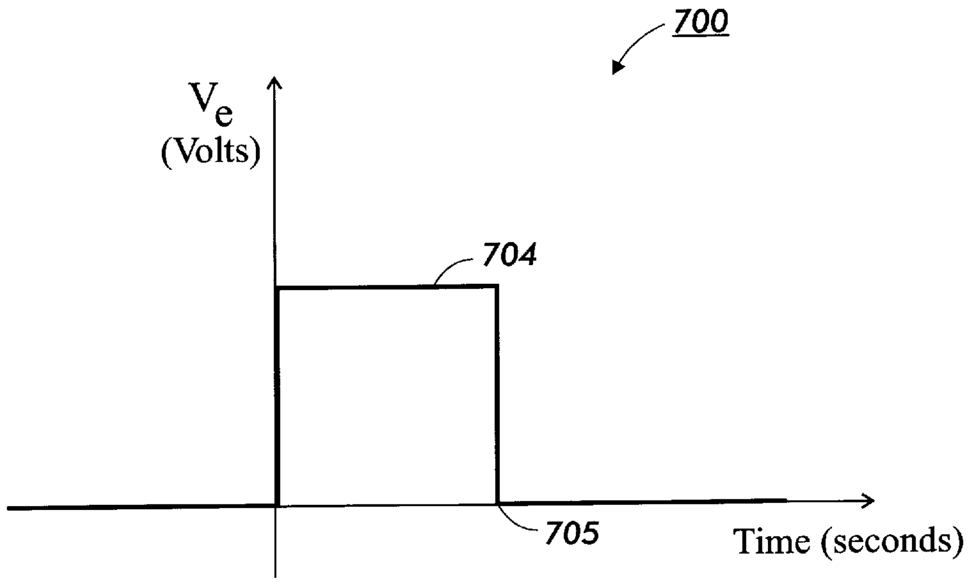
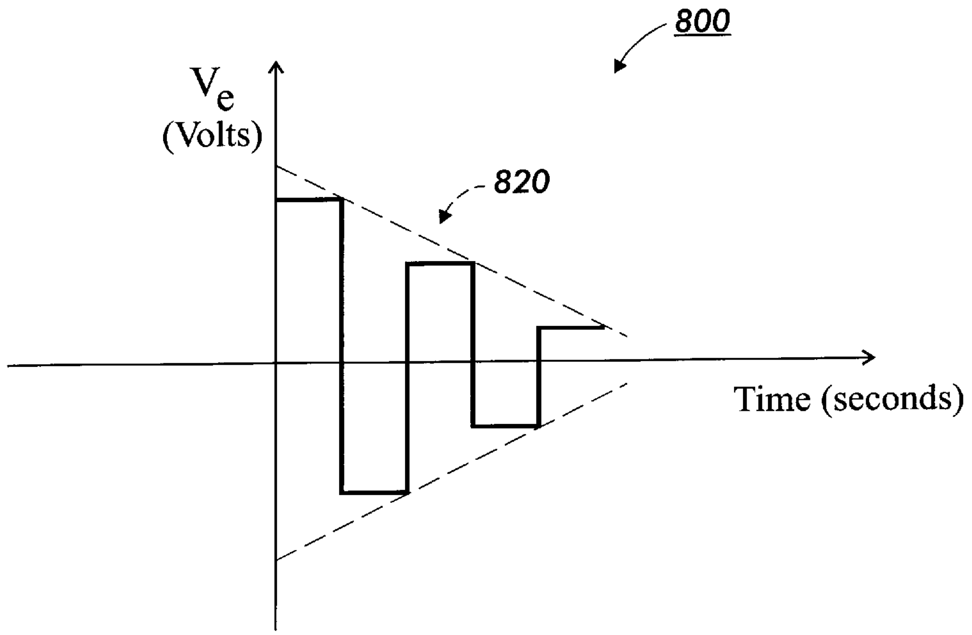
FIG. 8

FIG. 10
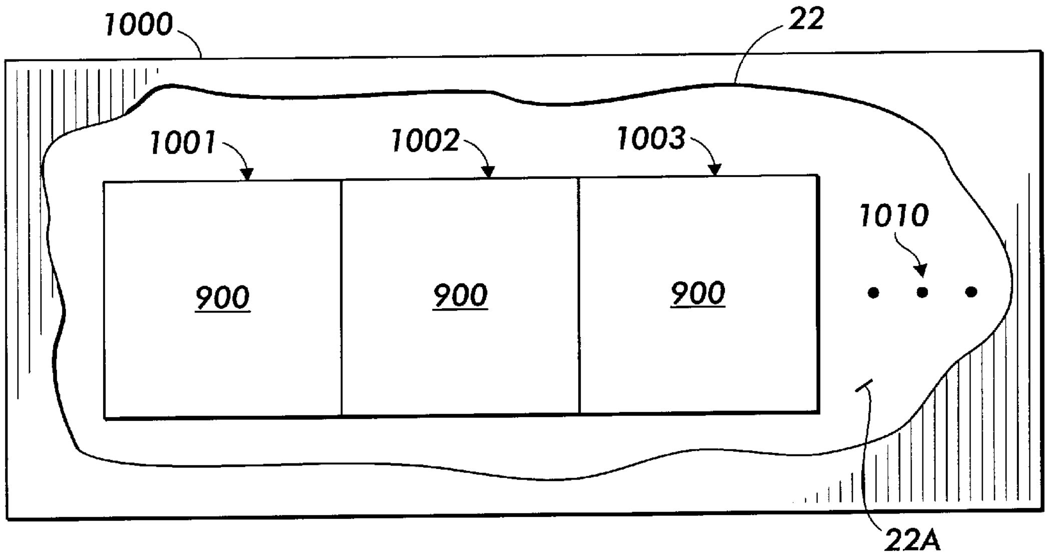
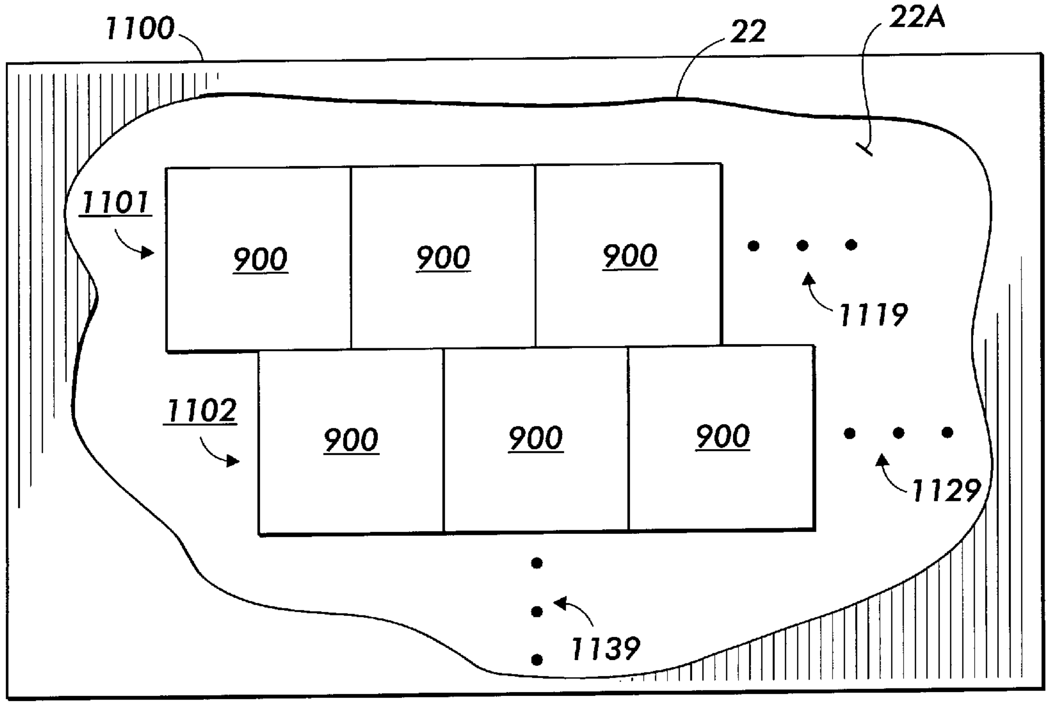
FIG. 11

FIG. 12
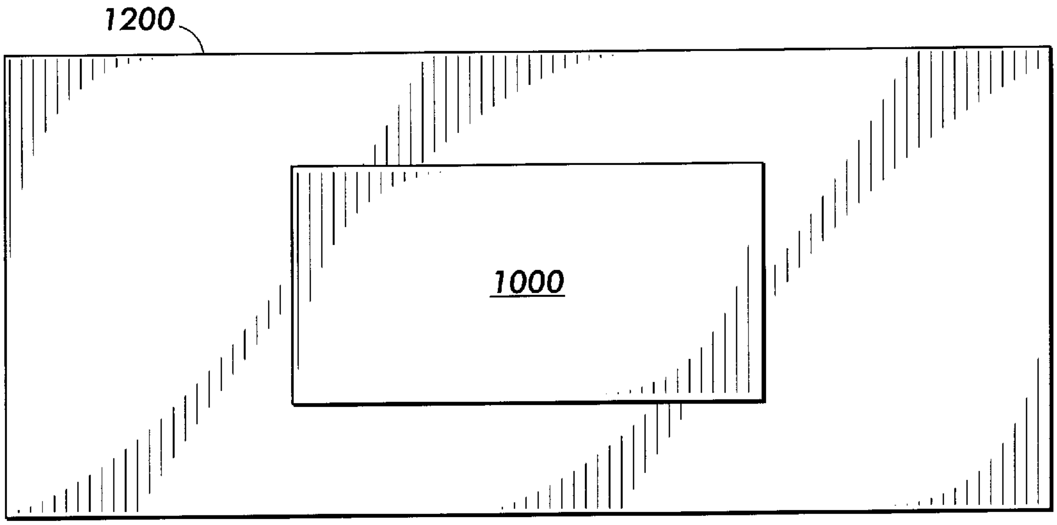
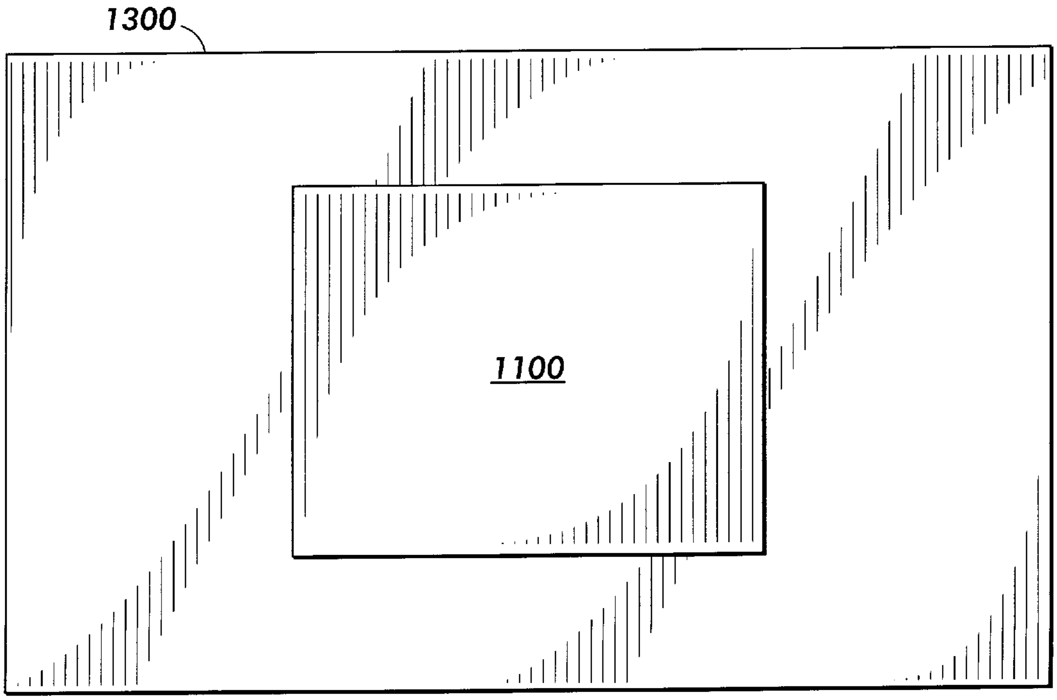
FIG. 13

METHOD OF FABRICATING A FLUID DROP EJECTOR

REFERENCE TO PRIOR PROVISIONAL APPLICATION

This patent application claims priority to U.S. Provisional Patent Application No. 60/104,363, entitled "Ejector Mechanism" filed Oct. 15, 1998.

FIELD OF THE INVENTION

The present invention is drawn to a silicon based fluid ejector mechanism which operates on the principle of electrostatic attraction.

BACKGROUND OF THE INVENTION

Most common ink jet drop ejectors are thermal or acoustic. Thermal ink jet (TIJ) technologies are based upon rapid nucleation which takes place within a channel containing a water based ink. Such a technology is very limited in its ability for "on demand" drop size modulation due to adding complexity and cost through the addition of multiple channel heaters of various sizes. The thermal ink jet technology is also limited in life characteristics due primarily to the intense heat that is generated and the subsequent thermal stressing and adverse reaction with inks. Additionally, thermal ejectors can be fairly inefficient and, as stated previously, can also generate a lot of heat.

Acoustic ejectors either displace a volume or propagate an acoustic pressure to generate a fluid drop. One of the most common of this type of technology is piezo based. Piezo technologies are theoretically capable of "on demand" drop size modulation and, because of the piezoelectric nature of their actuation, well designed applications have very long life characteristics. However, piezo based technologies are disadvantaged due to the high cost of processing piezo materials and the resulting size of an ink jet array (number of nozzles). Another type of acoustic ejector is Acoustic Ink Jet (AIP). Again, AIP suffers from the difficulty of making small structures such as 600 DPI, and also is fairly inefficient and costly.

Some electrostatically actuated ink jet technologies are based upon deformation of a membrane in a totally enclosed structure via electrostatic forces. Because of the totally enclosed, hence highly constrained structure, very large ejection mechanisms must be considered to compensate for the very small deformation of the membrane. This leads to very small drop sizes, very large ejection mechanisms, very large applied voltages and/or very high costs.

SUMMARY OF THE INVENTION

This invention is a fluid ejector that is low cost, uses standard silicon batch fabrication techniques, is useable with a wide variety of ink designs, reliable and ejects very small drops for gray scale printing. Some of the advantages of such a device over current types of ink jet ejectors (thermal, acoustic) are: drop size modulation can be achieved through controlling the amount of piston motion and the velocity of the piston (through the applied voltage/field); ink latitude (composition, type—i.e., water based, oil based) can be relatively large; various configurations (top shooter, side shooter, etc.) are possible consistent with the capabilities of production techniques, production costs will be low due to the use of common electronics industry surface micromachining technologies; and integrated electronic controls are achievable due to the nature of the silicon based production techniques used.

BRIEF DESCRIPTION OF THE DRAWINGS

FIG. 4 is a top view of a square piston.

FIG. 5 is a top view of a rectangular piston.

FIG. 6 is a top view of a round piston.

FIG. 7 depicts a first ejecting signal 700 comprising a step function.

FIG. 8 depicts a second ejecting signal 800 comprising a bipolar pulse train, including a decreasing envelope.

FIG. 10 depicts a top view of a 1-dimensional fluid drop ejector array 1000 comprising the FIG. 9 fluid drop ejectors.

FIG. 11 depicts a top view of a 2-dimensional fluid drop ejector array 1100 comprising the FIG. 9 fluid drop ejectors.

FIG. 12 depicts a first printing machine 1200 including the FIG. 10 array.

FIG. 13 depicts a second printing machine 1300 including the FIG. 11 array.

DESCRIPTION OF THE PREFERRED EMBODIMENTS

Figure 1:
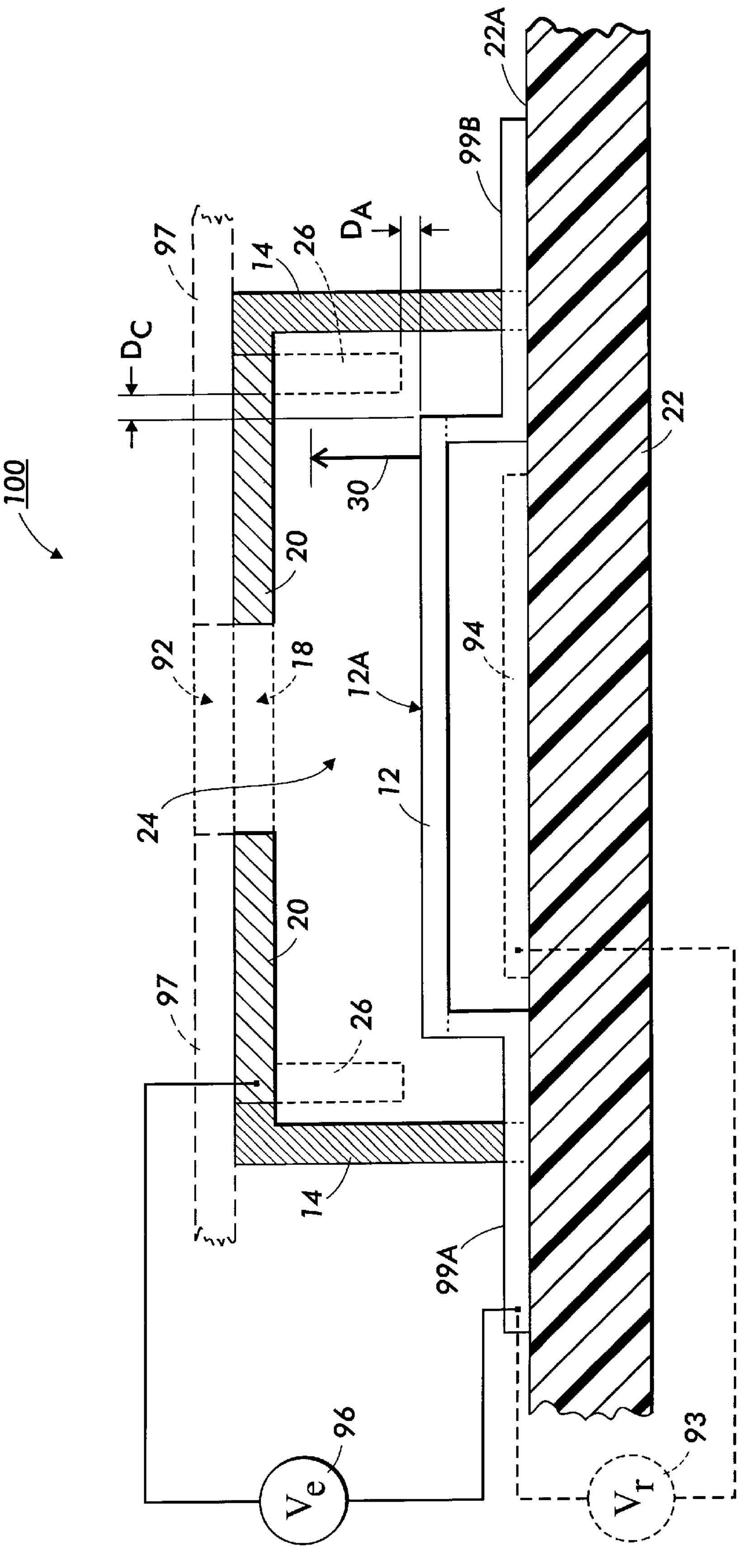
FIG. 1 is a cutaway profile view of a first embodiment of a fluid drop ejector 100.

FIG. 1 depicts a first embodiment of a fluid drop ejector 100. There is shown a fluid drop ejector 100 comprising a containment wall 14, a nozzle plate layer 20 disposed at one end of the containment wall 14, the nozzle plate layer 20 including a nozzle opening 18, a piston layer 12 disposed at the opposite end of the containment wall 14, the piston layer 12 comprising a piston surface 12A facing and substantially aligned with the nozzle opening 18, the containment wall 14, nozzle plate layer 20 and piston surface 12A defining a cavity 24 that is arranged for containing fluid, the piston layer 12 arranged for moving towards the nozzle opening 18 when a fluid ejecting electric field is applied between the piston layer 12 and the nozzle plate layer 20, thus causing fluid to be ejected through the nozzle opening 18.

It will be appreciated that the electric field between the piston layer 12 and the nozzle plate layer 20 comprises opposite charges and, as a result, piston layer 12 and nozzle plate layer 20 attract each other.

In one embodiment, the fluid comprises ink.

In one embodiment, the piston surface 12A is substantially square in shape, as shown in FIG. 4.

In another embodiment, the piston surface 12A is substantially rectangular in shape, as shown in FIG. 5.

In still another embodiment, the piston surface 12A is substantially circular in shape, as shown in FIG. 6.

Still referring to FIG. 1, the ejector device 100 includes ejecting signal means 96 for applying an ejecting signal between the piston layer 12 and the nozzle plate layer, the ejecting signal arranged for modulating the amount of fluid that is ejected through the nozzle opening 18.

As shown in FIG. 1, the piston surface 12A forms an ejection stroke 30 when the piston layer 12 moves towards the nozzle opening 18, the ejection stroke comprising an ejection stroke magnitude. In one embodiment, the ejecting signal 96 is arranged for controlling the ejection stroke magnitude 30.

It will be appreciated that the piston surface 12A forms a piston speed when the piston layer 12 moves towards the nozzle opening 18. In another embodiment, therefore, the ejecting signal 96 is arranged for controlling the piston speed.

In FIG. 7, there is shown a first embodiment of an ejecting signal 96. As shown, the ejecting signal comprises a step function 700. It will be appreciated that the magnitude 704 and the pulse duration 705 will modulate the amount of fluid ejected.

In FIG. 8, there is shown a second embodiment of the ejecting signal 96. As shown, the ejecting signal comprising a bipolar pulse train 800, including an envelope 820 that decreases in time.

Returning now to FIG. 1, the fluid drop ejector 100 comprises a substrate 22, the substrate 22 including a substrate surface 22A, with the containment wall being disposed on the substrate surface 22A. The fluid drop ejector 100 includes a plurality of piston springs 99A, 99B, 99C, 99D radiating away from the piston surface 12A and coupled to the substrate surface 22A. (FIG. 1 depicts piston springs 99A, 99B; the remaining piston springs 99C, 99D are depicted in FIGS. 4–6.) The plurality of piston springs 99A, 99B, 99C, 99D are arranged for providing mechanical spring tension for moving the piston layer 12 towards the substrate 22 when the fluid ejecting electric field is removed, and provide piston mounting and location.

In one embodiment, a faceplate layer 97, is disposed on the nozzle layer 20, the faceplate layer including a faceplate opening 92, substantially congruent with the nozzle opening 18.

The piston layer 12 is spaced a substantially fixed distance away from the substrate surface 22A. In one embodiment, a retractor layer 94 is disposed on the substrate surface 22A between the piston layer 12 and the substrate 22. In this embodiment, the piston layer 12 is arranged for moving towards the substrate 22 when a retracting electric field is applied between the piston layer 12 and the retractor layer 94, the retracting electric field being applied by a retracting signal means 93. This ensures the piston returns to its start position in a very short time and also ensures the piston moves below the containment wall for ink inlet.

Figure 2:
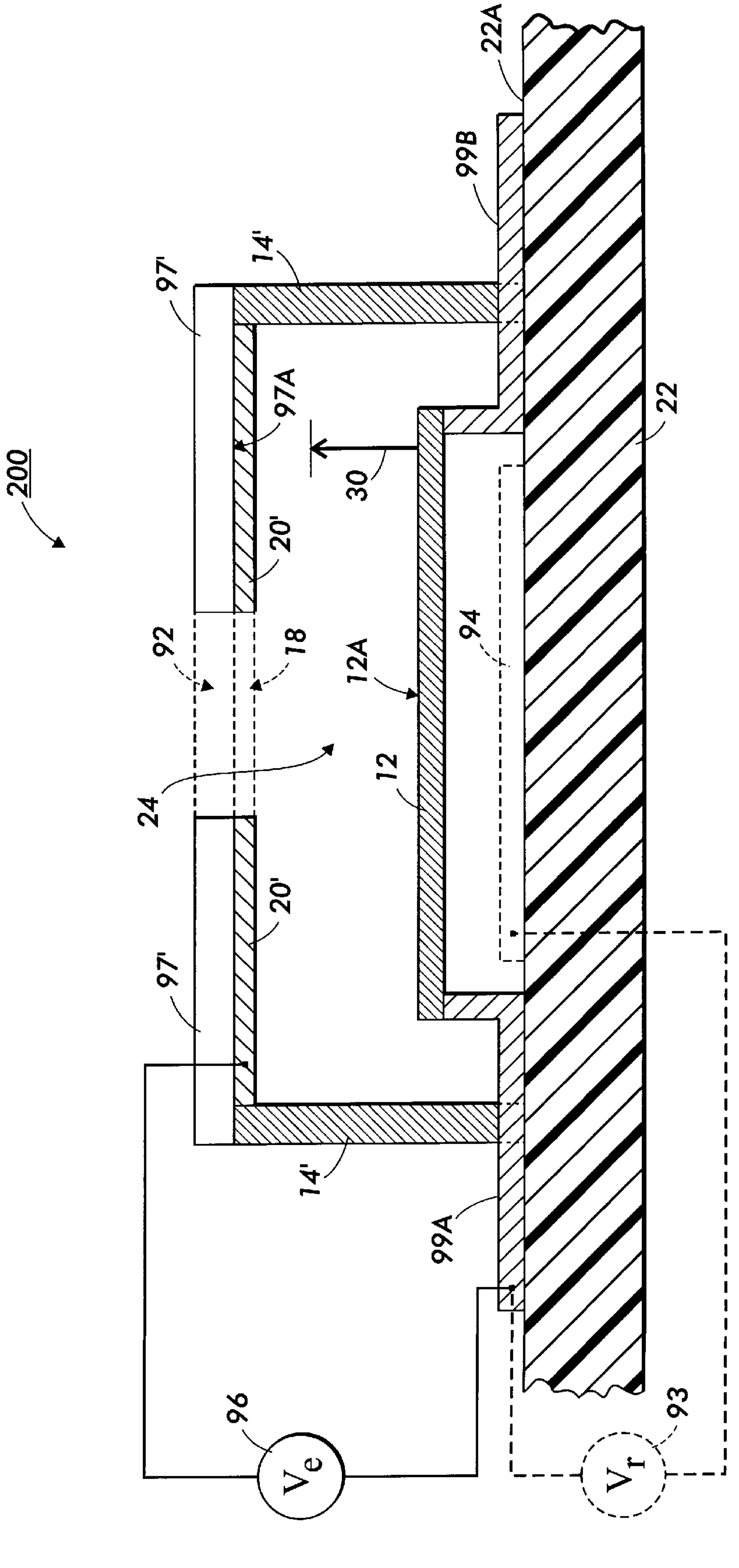
FIG. 2 is a cutaway profile view of a second embodiment of a fluid drop ejector 200.

FIG. 2 depicts a second embodiment of a fluid drop ejector 200. There is shown a fluid drop ejector 200 comprising a containment wall 14', a nozzle plate layer 20' disposed at one end of the containment wall 14', the nozzle plate layer 20' including a nozzle opening 18, a piston layer 12 disposed at the opposite end of the containment wall 14', the piston layer 12 comprising a piston surface 12A facing and substantially aligned with the nozzle opening 18, the containment wall 14', nozzle plate layer 20' and piston surface 12A defining a cavity 24 that is arranged for containing fluid, the piston layer 12 arranged for moving towards the nozzle opening 18 when a fluid ejecting electric field is applied between the piston layer 12 and the nozzle plate layer 20', thus causing fluid to be ejected through the nozzle opening 18.

As in FIG. 1, the electric field between the piston layer 12 and the nozzle plate layer 20' comprises opposite charges and, as a result, piston layer 12 and nozzle plate layer 20' attract each other.

As in FIG. 1, in one embodiment, the fluid comprises ink.

Also as in FIG. 1:

in one embodiment, the piston surface 12A is substantially square in shape, as shown in FIG. 4;

in another embodiment, the piston surface 12A is substantially rectangular in shape, as shown in FIG. 5; and In still another embodiment, the piston surface 12A is substantially circular in shape, as shown in FIG. 6.

Still referring to FIG. 2, the ejector device 200 includes ejecting signal means 96 for applying an ejecting signal between the piston layer 12 and the nozzle plate layer 20', the ejecting signal arranged for modulating the amount of fluid that is ejected through the nozzle opening 18.

The piston surface 12A forms an ejection stroke 30 when the piston layer 12 moves towards the nozzle opening 18, the ejection stroke comprising an ejection stroke magnitude. In one embodiment, the ejecting signal 96 is arranged for controlling the ejection stroke magnitude 30.

It will be appreciated that the piston surface 12A forms a piston speed when the piston layer 12 moves towards the nozzle opening 18. In another embodiment, therefore, the ejecting signal 96 is arranged for controlling the piston speed. For example, the ejecting signal 96 may comprise the first waveform 700 of FIG. 7, or the second waveform 800 of FIG. 8.

Returning now to FIG. 2, similar to the first embodiment 100 of FIG. 1, the fluid drop ejector 200 comprises a substrate 22, the substrate 22 including a substrate surface 22A, with the containment wall 14' being disposed on the substrate surface 22A. The fluid drop ejector 200 includes a plurality of piston springs 99A, 99B, 99C, 99D radiating away from the piston surface 12A and coupled to the substrate surface 22A. (FIG. 2 depicts piston springs 99A, 99B; the remaining piston springs 99C, 99D are depicted in FIGS. 4–6.) The plurality of piston springs 99A, 99B, 99C, 99D are arranged for providing mechanical spring tension for moving the piston layer 12 towards the substrate 22 when the fluid ejecting electric field is removed.

As shown in FIG. 2, the fluid drop ejector 200 includes a faceplate layer 97' disposed on the nozzle layer 20', the faceplate layer including a faceplate opening 92, substantially congruent with the nozzle opening 18.

The piston layer 12 is spaced a substantially fixed distance away from the substrate surface 22A. In one embodiment, a retractor layer 94 is disposed on the substrate surface 22A between the piston layer 12 and the substrate 22. In this embodiment, the piston layer 12 is arranged for moving towards the substrate 22 when a retracting electric field is applied between the piston layer 12 and the retractor layer 94, the retracting electric field being applied by a retracting signal means 93.

Figure 3:
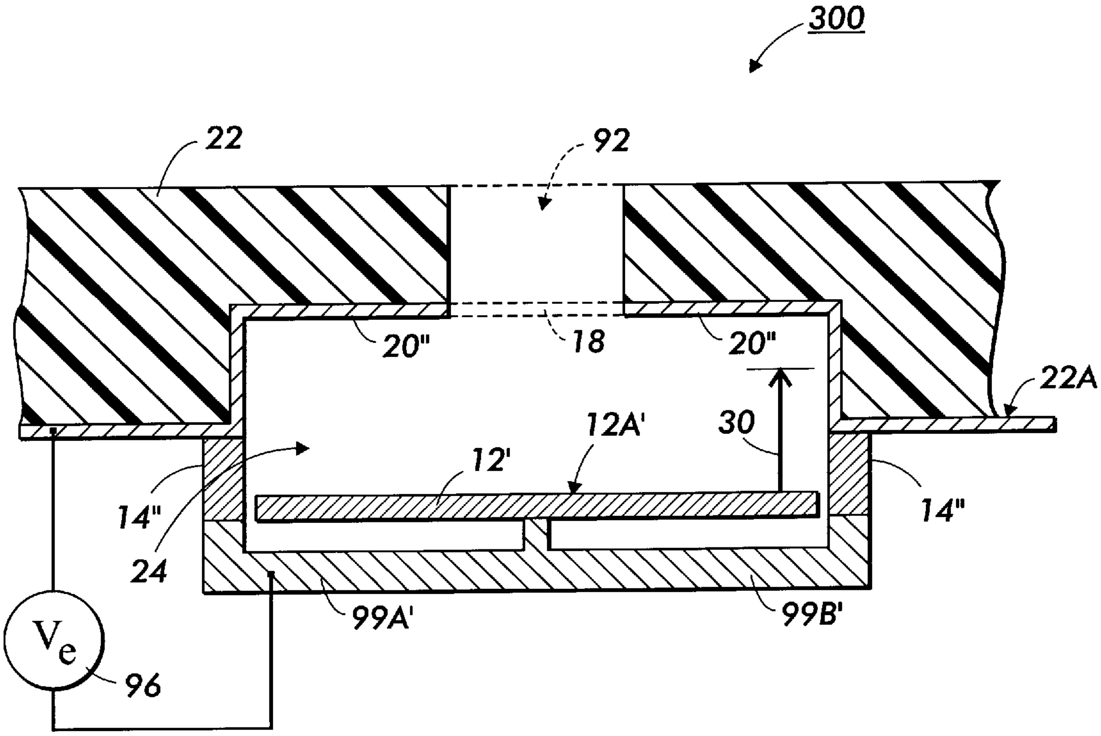
FIG. 3 is a cutaway profile view of a third embodiment of a fluid drop ejector 300.

FIG. 3 depicts a third embodiment of a fluid drop ejector 300. There is shown a fluid drop ejector 300 comprising a containment wall 14", a nozzle plate layer 20" disposed at one end of the containment wall 14", the nozzle plate layer 20" including a nozzle opening 18, a piston layer 12' disposed at the opposite end of the containment wall 14". The piston layer 12' comprises a piston surface 12A' facing and substantially aligned with the nozzle opening 18. The containment wall 14", nozzle plate layer 20" and piston surface 12A' define a cavity 24 that is arranged for containing fluid. The piston layer 12' is arranged for moving towards the nozzle opening 18 when a fluid ejecting electric field is applied between the piston layer and the nozzle plate layer 20", thus causing fluid to be ejected through the nozzle opening 18. The fluid drop ejector 300 further comprises a substrate 22, the substrate 22 including a substrate surface 22A. The nozzle plate layer 20" is disposed on the substrate surface 22A. The substrate layer 22 includes a substrate opening 93 substantially congruent with the nozzle opening 18.

As in FIGS. 1–2, the electric field between the piston layer 12' and the nozzle plate layer 20" comprises opposite charges and, as a result, piston layer 12' and nozzle plate layer 20" attract each other.

As in FIGS. 1–2, in one embodiment, the fluid comprises ink.

Also as in FIG. 1–2:

in one embodiment, the piston surface 12A' is substantially square in shape, similar to piston surface 12A shown in FIG. 4;

in another embodiment, the piston surface 12A' is substantially rectangular in shape, similar to piston surface 12A shown in FIG. 5; and in still another embodiment, the piston surface 12A' is substantially circular in shape, similar to piston surface 12A shown in FIG. 6.

Still referring to FIG. 3, the ejector device 300 includes ejecting signal means 96 for applying an ejecting signal between the piston layer 12' and the nozzle plate layer 20", the ejecting signal arranged for modulating the amount of fluid that is ejected through the nozzle opening 18.

The piston surface 12A' forms an ejection stroke 30 when the piston layer moves towards the nozzle opening 18, the ejection stroke comprising an ejection stroke magnitude. In one embodiment, the ejecting signal 96 is arranged for controlling the ejection stroke magnitude 30.

It will be appreciated that the piston surface 12A' forms a piston speed when the piston layer moves towards the nozzle opening 18. In another embodiment, therefore, the ejecting signal 96 is arranged for controlling the piston speed. For example, the ejecting signal 96 may comprise the first waveform 700 of FIG. 7, or the second waveform 800 of FIG. 8.

Returning now to FIG. 3, the fluid drop ejector 300 includes a plurality of piston springs 99A' and 99B' radiating away from the piston surface 12A' and coupled to containment wall 14". The plurality of piston springs 99A' and 99B' are arranged for providing mechanical spring tension for moving the piston layer 12' towards the substrate 22 when the fluid ejecting electric field is removed.

Figure 9:
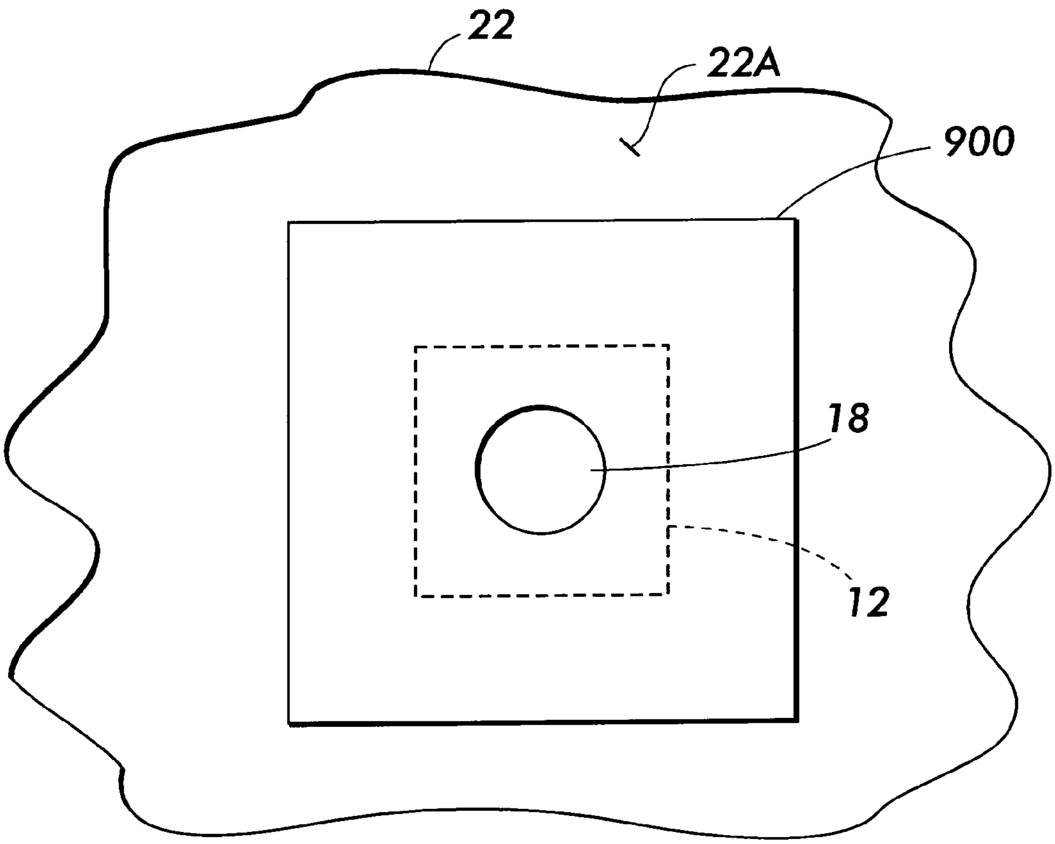
FIG. 9 depicts a top view of a fluid drop ejector.

FIG. 9 depicts a top view of a fluid drop ejector 900. The ejector 900 may comprise any of the foregoing fluid drop ejector embodiments, namely, the first embodiment 100 of FIG. 1, the second embodiment 200 of FIG. 2, or the third embodiment 300 of FIG. 3. As shown, the ejector 900 includes a square-shaped piston surface 12. However, it will be appreciated that, in the alternative, a round- or rectangular-shaped piston surface 12 may be used.

FIG. 10 depicts a top view of a 1-dimensional array 1000 of fluid drop ejectors, each ejector comprising the FIG. 9 fluid drop ejector. While three (3) ejectors 1001–1003 are shown, it will be appreciated that any number of ejectors may be added, represented by the symbol 1010, to form any page-width size.

FIG. 11 depicts a top view of a 2-dimensional array 1100 of fluid drop ejectors, each ejector comprising the FIG. 9 fluid drop ejector. While the array 1100 is depicted as comprising 2 ejector rows 1101 and 1102, it will be appreciated that any number of ejector rows may be added, represented by the symbol 1139. Also, while each row 1101 and 1102 is depicted as comprising three (3) ejectors each, it will be appreciated that any number of ejectors may be added to each row, represented by the symbols 1119 and 1129, to form any page-width size.

FIG. 12 depicts a first printing machine 1200 which includes the 1-dimensional array 1000 of FIG. 10.

FIG. 13 depicts a second printing machine 1300 which includes the 2-dimensional array 1100 of FIG. 11.

FIGS. 14–21 depict a method of fabricating a fluid drop ejector.

Figure 14:
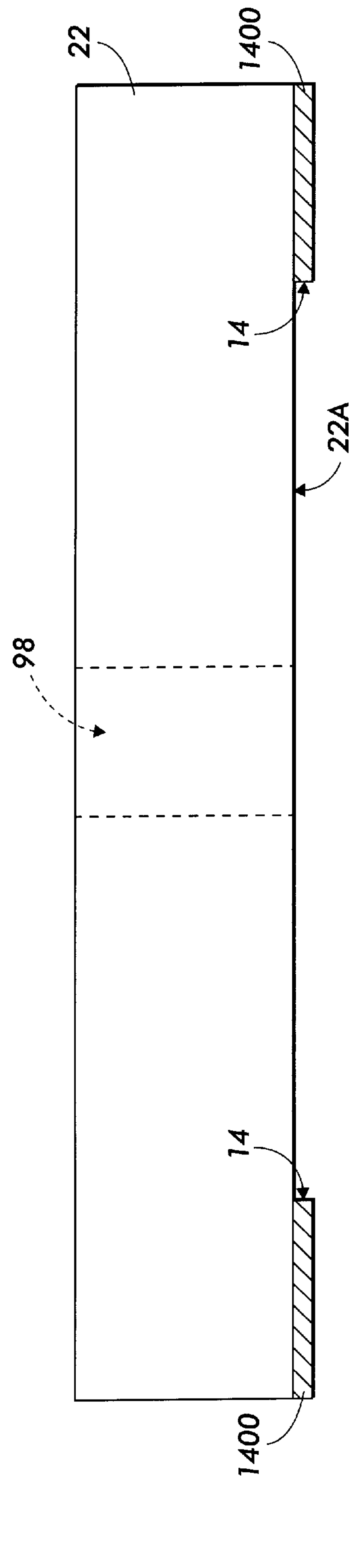
FIGS. 14–21 depict a method of fabricating a fluid drop ejector.

In FIG. 14, in one embodiment an optional $SiO_2$ mask layer 1400 is deposited on the substrate surface 22A.

Still referring to FIG. 14, in one embodiment an ink inlet channel 98 is provided to allow ink to be supplied to the cavity 24.

Figure 15:
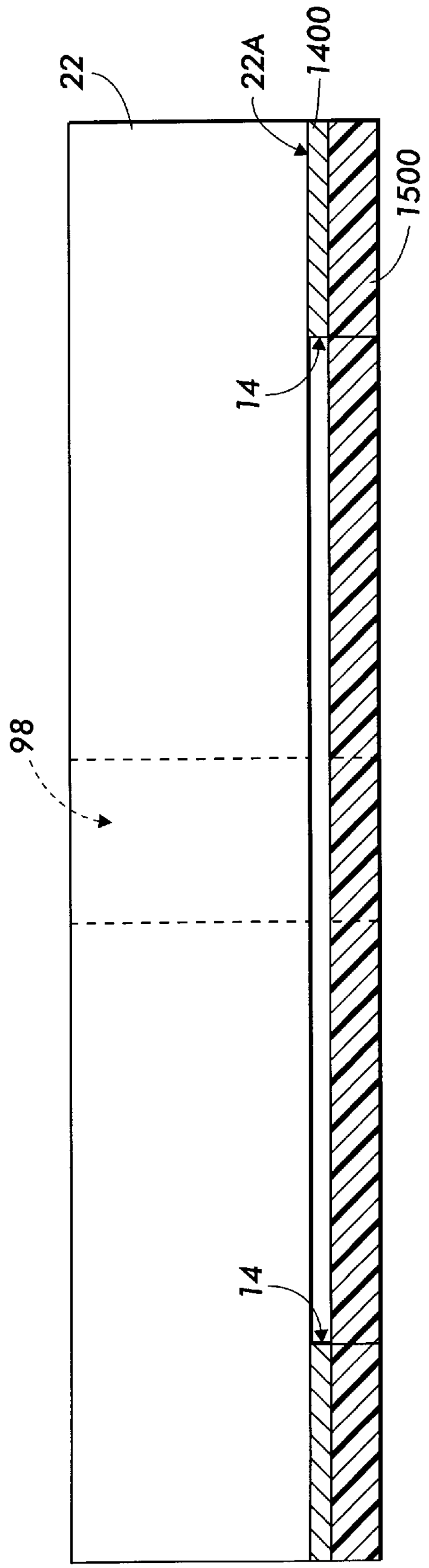

In FIG. 15, a $SiNi_x$ layer 1500 is deposited. Note the containment walls 14 are beginning to be formed.

Figure 16:
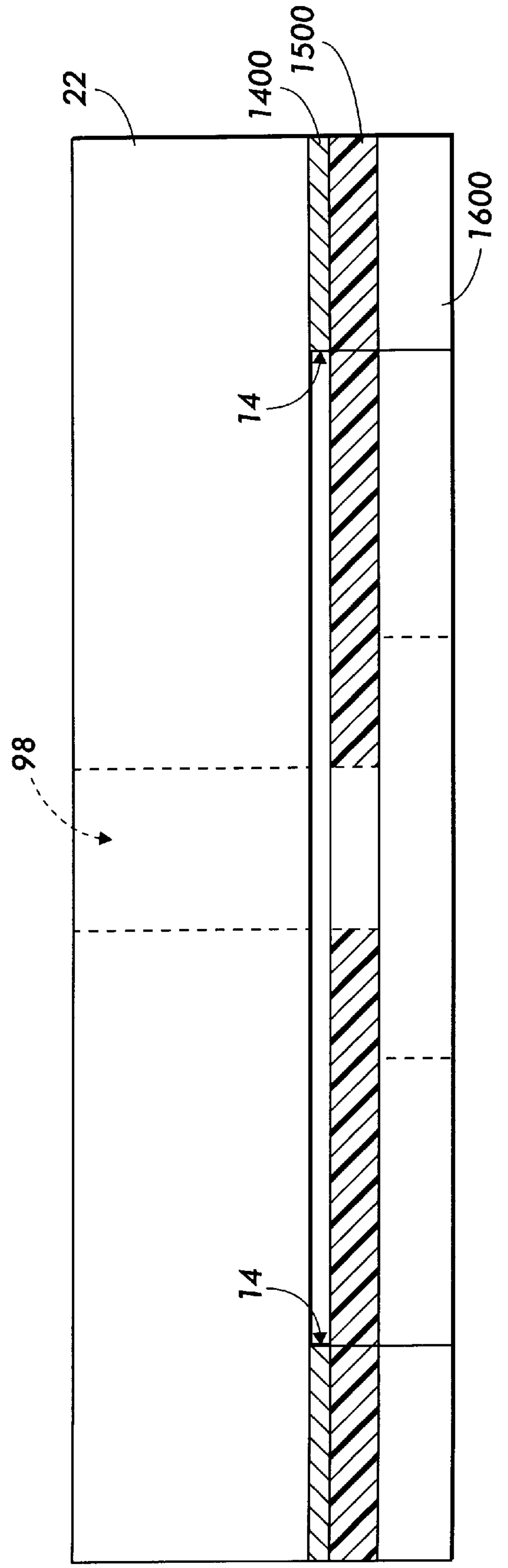

In FIG. 16, a polysilicon "0" layer 1600 is deposited.

Figure 17:
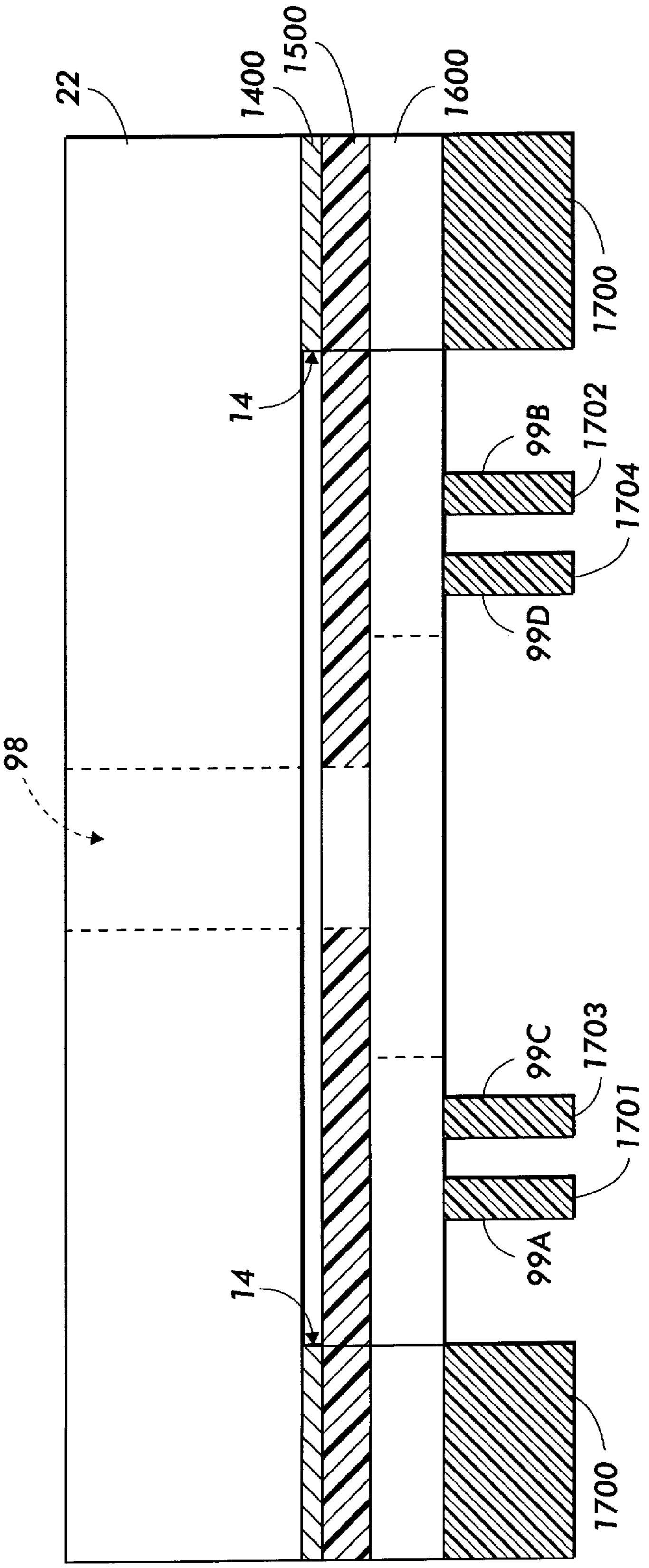

In FIG. 17, a sacrificial oxide layer 1700 is deposited in a pattern such that regions 1701, 1702, 1703 and 1704 are formed. These latter regions 1701–1704 will later form attachment points for the piston spring legs 99A, 99B, 99C, and 99D. The pattern in layer 1700 also provides electrical connections for the piston spring legs 99A–99D.

Figure 18:
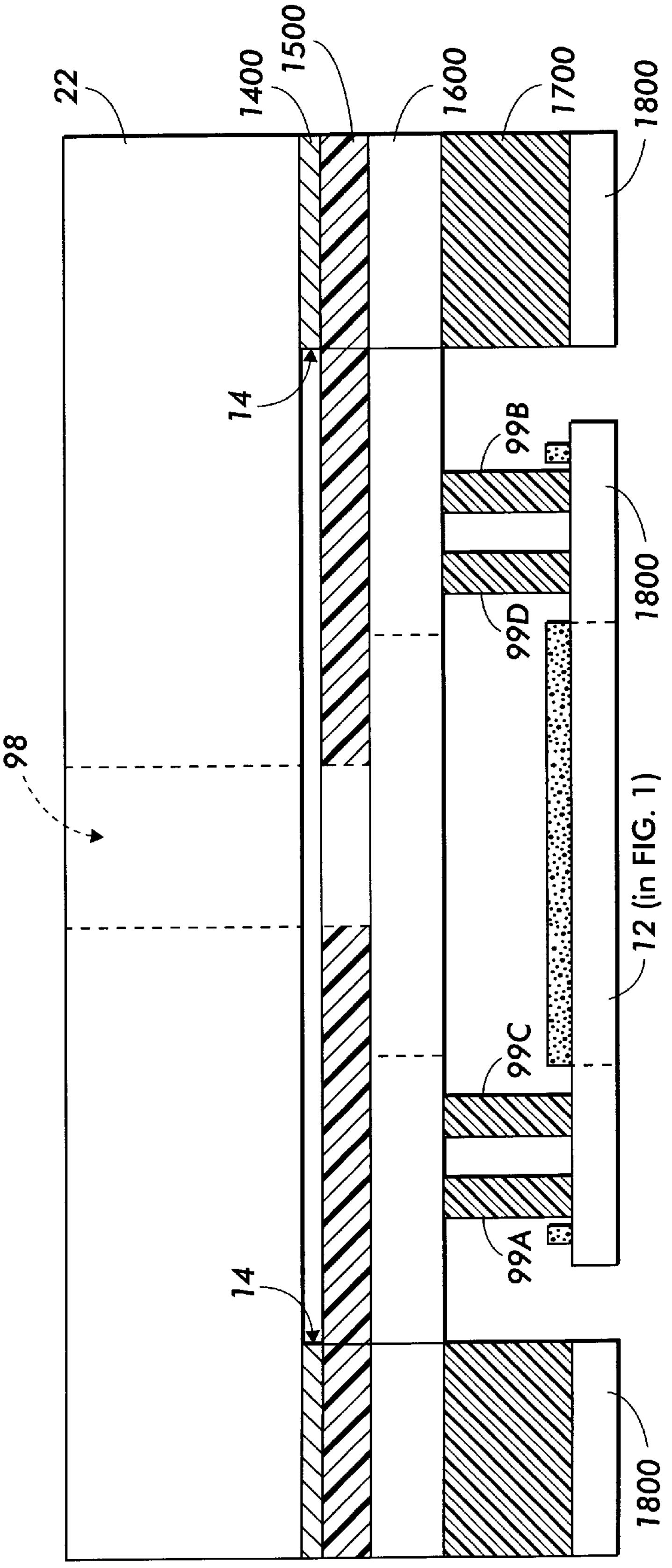

In FIG. 18, a polysilicon "1" layer 1800 is deposited. Note the layer 1800 comprises the piston layer 12.

Figure 19:
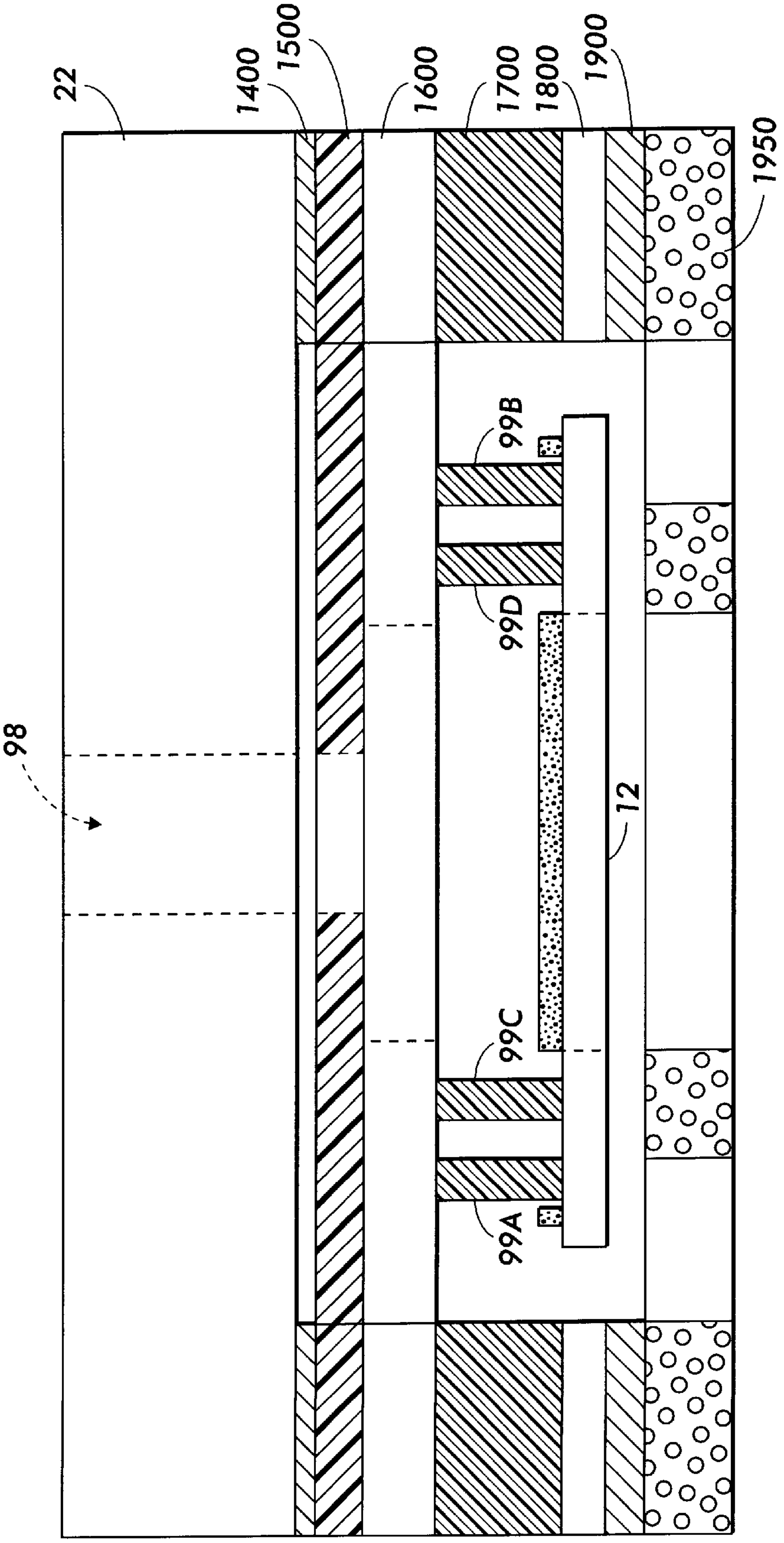

In FIG. 19, a further sacrificial oxide layer 1900 is deposited. Also in FIG. 19, a polysilicon "2" layer 1950 is deposited.

Figure 20:
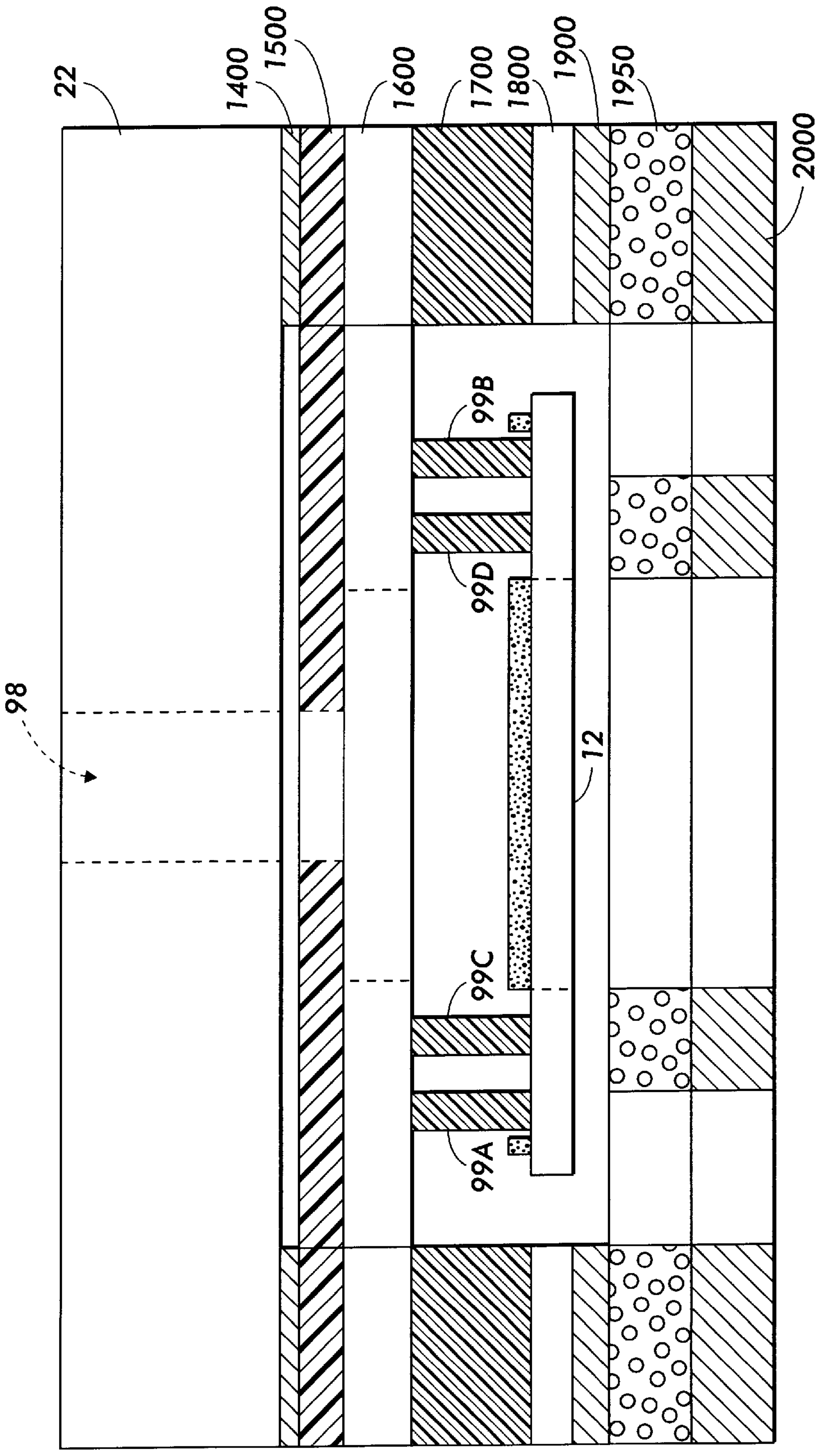

In FIG. 20, a still further sacrificial oxide layer 2000 is deposited.

Figure 21:
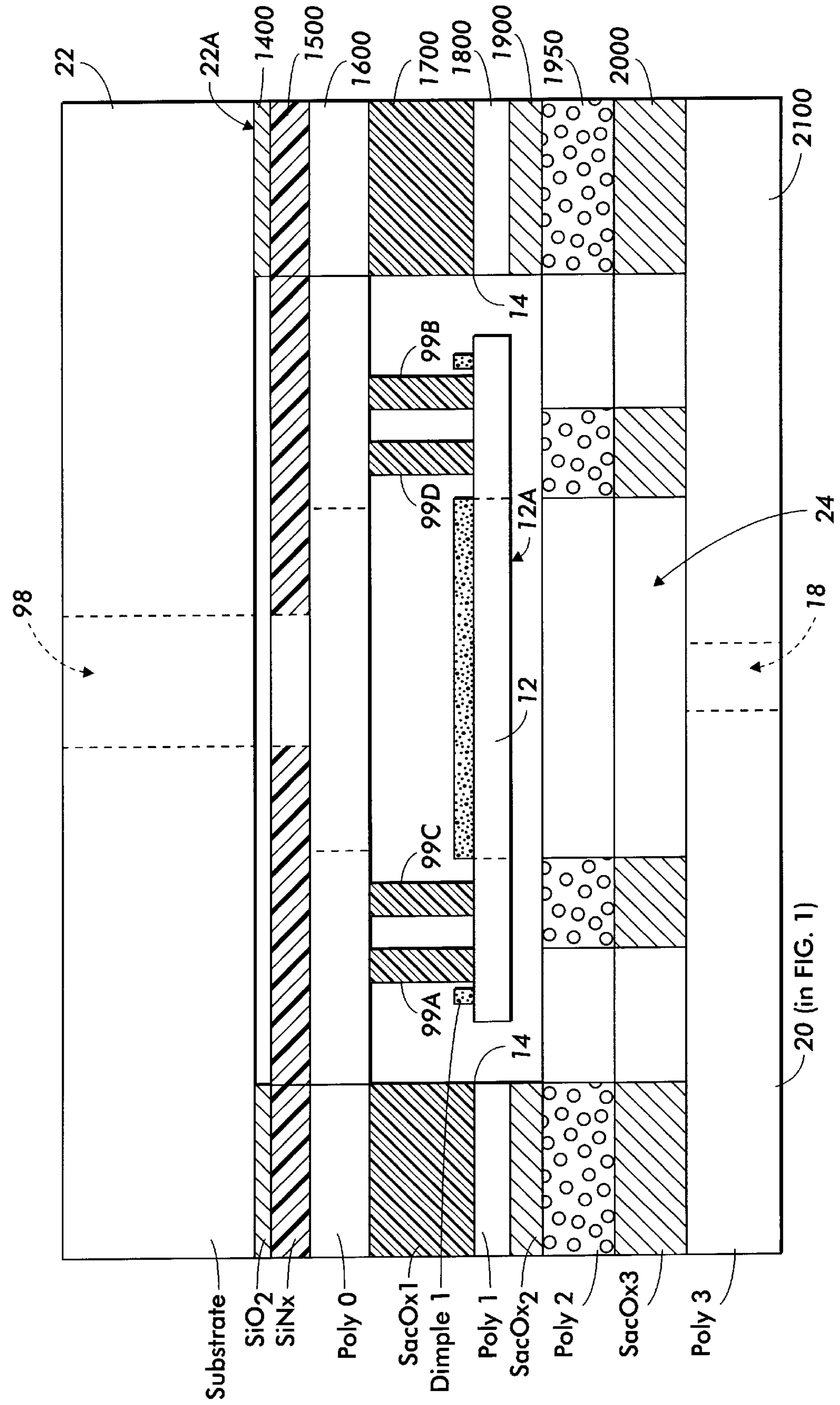

In FIG. 21, a polysilicon "3" layer 2100 is provided. Note that layer 2100 corresponds to nozzle layer 20 in FIG. 1. Also note that layer 2100 includes a nozzle opening 18.

Still referring to FIG. 21, the optional $SiO_2$ mask layer 1400, $SiNi_x$ layer 1500, polysilicon "0" layer 1600, sacrificial oxide layer 1700, polysilicon "1" layer 1800, further sacrificial oxide layer 1900, polysilicon "2" layer 1950, and still further sacrificial oxide layer 2000 comprise the containment wall 14. Moreover, the containment wall 14, polysilicon "3" layer 2100 (nozzle plate layer 20 in FIG. 1) and piston surface 12A (polysilicon "1" layer 1800) define a cavity 24 that is arranged for containing fluid.

Preferably the devices 100, 200, 300 will be surface micromachined on silicon substrate 22.

Electrostatic piston drop ejectors can be designed to eject a drop normal to the silicon substrate surface 22A (top shooter as in FIGS. 1–2), or into the silicon substrate 22 (bottom shooter as in FIG. 3). The top shooter embodiments shown in FIGS. 1–2 can be fabricated using Sandia National Laboratories' five layer surface micromachined polysilicon SUMMiT process.

Fluid is drawn into an ejection cavity 24 by flowing between the edge of the piston and the containment wall using passive capillary pressure or active external pump means. A voltage V is applied between the ejection electrode, which is the face of the ejector containing the ejection orifice, and the piston structure.

Mechanical spring structure 99A, 99B, 99C, 99D may take the form of a serpentine spring with a varying number of legs and leg dimensions, two crossed beams, a triple simply supported beam structure, a coil retraction structure, a four beam piston support, and a centrally supported structure with three retraction legs, as well as any other biasing support structure.

Piston movement 30 causes an increase in fluid pressure within ejection cavity 24, causing a drop of fluid to be ejected through ejection orifice 18.

As shown in FIG. 1, the ejection pressure achievable is controlled by several factors, one of which is the clearance between the piston perimeter and the "cylinder walls" 26, which are disposed on the nozzle plate layer 20. This clearance area should be kept small relative to the "swept" area of the piston for best performance. This approach eliminates the problems of the totally sealed zero clearance, "oil can" type of electrostatic ejection mechanisms heretofore considered. Once the ejection stroke 30 of the piston is completed, the ejecting voltage 96 to the electrodes are shut down, either instantaneously or in a controlled fashion, and the retraction mechanism 99A, 99B, 99C, 99D causes the piston 12 to return to its rest position.

One of the key areas which distinguishes this approach from other approaches to electrostatic ink jet concepts is the provision for a small clearance dimension $D_C$ between the outer perimeter of the driven piston which forcibly expels the drop and the inner part of the constraining cylinder wall 26. In one possible embodiment, the piston stops in its rest position such that the piston stops flush with top of the cylinder wall 26 ($D_A$ equals 0 in this case). In such an embodiment, the dimension $D_C$ governs refill performance and must obviously be kept reasonably small to enable pressure build-up and consequent drop expulsion as the piston is driven towards the orifice plate. As the piston retracts, refill of the ejection chamber is accomplished through fluid making its way through this small dimension. Since the maximum operating speed can be determined in large part to the amount of the total cycle time that must be allowed for refill, the dynamics of this fluid flow can obviously limit the operating speed of such a device through the fluidic resistance that it imposes.

To alleviate the above situation an actuator design which allows the piston "rest" position to be slightly "above" the cylinder wall 26. In this case $D_A$ is greater than zero. This added dimension, allowing the piston to retract slightly into the open ink "pool" creates a very low resistance annular passage through which the fluid can flow back into the ejection chamber, hence greater operating speed potential.

As shown in FIGS. 7–8, a tailored voltage application profile to effect the desired piston motion may also be used. For increased performance capability, rather than simply turning the electric field "on" and "off" at the prescribed times, a tailored voltage profile is applied which generates the required piston dynamics. For instance, at the initiation of piston motion a high voltage would be applied. This, for example only, could be linearly decreased as the piston progresses through its motion. Such a tailoring of piston motion/pressures could result in higher drop ejection performance more controlled droplet ejection velocity, etc.

In the relatively simple piston motion control system described above, as shown in FIG. 7, the actuating voltage is "on" for a prescribed amount of time followed by turning the voltage "off" at the appropriate time to cease piston motion. The piston position is thus inferred as a function of time. To ensure accurate piston motion, a piston motion sensing and feedback control system can be used. For increased performance capability, what is proposed is rather than simply turning the electric field "on" and "off" at the prescribed times, the position of the piston is sensed in its motion via sensing the capacitance changes between the two electrodes piston and orifice plate. The sensing of the position enables a more accurate and robust control mechanism via the real time variation of applied voltages.

For increased performance capability, an active return mechanism (the retractor layer 94 in FIGS. 1–2) may be used. Rather than simply turning the electric field off and allowing the spring to return the piston to its rest position, the voltage is maintained on the piston member but switched from the orifice plate to the ejector substrate. This reverses the field that is acting upon the piston and causes an additional active force to be applied to the piston to allow for significantly increased performance in terms of operating speed refill performance.

In summary, the ejector mechanisms 100, 200, 300 shown in FIGS. 1–3 are based upon the production technique of surface micromachining. As can be seen, the size of the drop ejected is dependent upon the volume displaced by the piston mechanism. For a given required drop size and a given possible microstructure height, the cross sectional area of the ejector is then determined. If the required drop size is large, the possible microstructure height is small, then either the cross sectional area of the individual ejector must increase to compensate or the number of individual small ejectors must increase each delivering a fraction of the ink required for proper fill of the pixel. In either case, a two dimensional array (shown in FIG. 11) may be required.

To reduce the probability of the need for a two dimensional array, a method of increasing the possible active height of the ejector microstructure is proposed using a production technique based upon two commonly available production technologies; high aspect ratio etch technology combined with surface micromachining. The following briefly describes the construction of such a device using the combined techniques of high aspect ratio etch technology and surface micromachining.

The electrodes are designed to work with both conductive and non-conductive inks. Materials exposed to ink (internal to the fluid ejector) are wettable hydrophilic surfaces and with a contact angle with ink being less than 40 degrees. There are no wear material requirements, but ink washability requirements. There can be no peeling or pin holes because inks are very aggressive with a pH greater than 8. Some typical materials are Parylene, silicon carbide and Tantallum, if Tantallum meets resistivity requirements.

Other material requirements include materials exposed to air, such as the nozzle and front face are non-wettable hydrophobic surfaces and the contact angle with ink is less than 75 degrees. There are wear requirements with the materials exposed to air. Typical materials include DLC+ Fluorinated hydrocarbon, MERF PTFE base.

Pagewidth applications of the fluid ejector mechanism are shown in FIGS. 10 and 11. The pagewidth arrays 1000 and 1100 greatly increase productivity while offering significant cost and power advantages over other pagewidth ink jet arrays being considered for different technologies TIJ, piezo, acoustic. This greatly increases productivity over partial width arrays. Further, a pagewidth array of electrostatic fluid ejectors offers significant cost manufacturing process driven and power and size physics driven advantages over full width arrays considered for other ink jet technologies thermal, acoustic.

Dependent upon the requirements for ejected drop size and the microstructure manufacturing process selected, it may be highly beneficial to use a fluid ejector system as a two dimensional array 1100 shown in FIG. 11. For instance, the ejected drop size is dependent upon the stroke length of the piston. If the required drop size is larger than what can be delivered by this stroke, one approach is to slow the system down and place multiple drops within a very short distance of each other, essentially growing the developed spot. This is done in some ink jet applications today. Another approach is to grow the diameter of piston bore, since the ejected drop volume goes as approximately as the square of this dimension. However, this new size may not be compatible with a linear array whose ejector center to center distance is equal to the desired printing resolution i.e., 300 dpi, 600 dpi, etc. A solution is to place the ink jet ejectors in a 2 dimensional array. Due to the nature of the manufacturing processes used, such an array can be fabricated with little cost increase over a more conventional linear array.

The nozzle plate 20 can be fabricated from a thin film that is coated on one surface front face 97 for hydrophoebicity and on the other for electrical conductivity (electrode side) and then the nozzles are laser ablated. The plate is then aligned and affixed with adhesives to the electrostatic actuator mechanism. This approach facilitates the coating of the internal components of the electrostatic ejector and manufacturing of a robust nozzle plate.

An example of the face plate 97 design is similar to a TIJ design, except for the conductive inner surface coating 80, is a 25–50 micron thick film of Upilex film coated on one side with a hydrophobic coating of thickness less than 2 microns. Requirements of coating are well established by TIJ that include compatibility with TIJ inks and durability to wiping blade.

The other side is selectively etched and has a semiconductive coating that is resistant to ink. The etched patterns include only the electrodes and not the nozzles which will be laser ablated and not the areas where it will be attached to the drop ejector since an electrically insulative contact is needed.

On the second side, the film is coated with an adhesive of thickness around 5 microns. Types of adhesives are well established by TIJ. Holes are ablated through Upilex film. Holes are round, 10–25 micron in diameter, on a spacing of 42.3–13 micron centers. The total array length may be manufacture as desired.

While various embodiments of a method of fabricating a fluid drop ejector, in accordance with the present invention, have been described hereinabove, the scope of the invention is defined by the following claims.

We claim:

1. A method of fabricating a fluid drop ejector on a substrate surface, comprising the steps of:

(a) depositing a $SiNi_x$ layer;

(b) depositing a polysilicon "0" layer;

(c) depositing a first sacrificial oxide layer;

(d) depositing a polysilicon "1" layer;

(e) depositing a second sacrificial oxide layer;

(f) depositing a polysilicon "2" layer;

(g) depositing a third sacrificial oxide layer; and (h) depositing a polysilicon "3" layer, the $SiNi_x$, polysilicon "0", first sacrificial oxide, polysilicon "1", second sacrificial oxide, polysilicon "2", and third sacrificial oxide layers comprising a containment wall;

the polysilicon "3" layer comprising a nozzle plate layer disposed on the containment wall, the nozzle plate layer including a nozzle opening;

the first sacrificial oxide and polysilicon "1" layers comprising a piston layer including a piston surface facing and substantially aligned with the nozzle opening, the containment wall, nozzle plate layer and piston surface defining a cavity that is arranged for containing fluid, the piston layer arranged for moving towards the nozzle opening when a fluid ejecting electric field is applied between the piston layer and the nozzle plate layer, thus causing fluid to be ejected through the nozzle opening.

2. The method of claim 1, the first sacrificial oxide layer comprising a plurality of piston springs radiating away from the piston surface and coupled to the substrate surface.

3. The method of claim 2, the plurality of piston springs comprising means for applying an ejecting signal to the piston layer.

4. The method of claim 1, the fluid comprising ink.

5. A method of fabricating a fluid drop ejector on a substrate surface, comprising the steps of:

(a) depositing a $SiO_2$ mask layer;

(b) depositing a $SiNi_x$ layer;

(c) depositing a polysilicon "0" layer;

(d) depositing a first sacrificial oxide layer;

(e) depositing a polysilicon "1" layer;

(f) depositing a second sacrificial oxide layer;

(g) depositing a polysilicon "2" layer;

(h) depositing a third sacrificial oxide layer; and (i) depositing a polysilicon "3" layer, the $SiO_2$ mask, $SiNi_x$, polysilicon "0", first sacrificial oxide, polysilicon "1", second sacrificial oxide, polysilicon "2", and third sacrificial oxide layers comprising a containment wall;

the polysilicon "3" layer comprising a nozzle plate layer disposed on the containment wall, the nozzle plate layer including a nozzle opening;

the first sacrificial oxide and polysilicon "1" layers comprising a piston layer including a piston surface facing and substantially aligned with the nozzle opening, the containment wall, nozzle plate layer and piston surface defining a cavity that is arranged for containing fluid, the piston layer arranged for moving towards the nozzle opening when a fluid ejecting electric field is applied between the piston layer and the nozzle plate layer, thus causing fluid to be ejected through the nozzle opening.

6. The method of claim 5, the first sacrificial oxide layer comprising a plurality of piston springs radiating away from the piston surface and coupled to the substrate surface.

7. The method of claim 6, the plurality of piston springs comprising means for applying an ejecting signal to the piston layer.

8. The method of claim 5, the fluid comprising ink.

* * * * *